United States Patent
Chen et al.

(10) Patent No.: US 9,928,966 B2
(45) Date of Patent: Mar. 27, 2018

(54) NANOSTRUCTURED ELECTROLYTIC ENERGY STORAGE DEVICES

(71) Applicant: Intel Corporation, Santa Clara, CA (US)

(72) Inventors: Zhaohui Chen, San Jose, CA (US); Donald S. Gardner, Los Altos, CA (US); Bum Ki Moon, Santa Clara, CA (US); Charles W. Holzwarth, San Jose, CA (US); Cary L. Pint, Nashville, TN (US); Scott B. Clendenning, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 101 days.

(21) Appl. No.: 13/730,324

(22) Filed: Dec. 28, 2012

(65) Prior Publication Data
US 2014/0185260 A1 Jul. 3, 2014

(51) Int. Cl.
*H05K 1/18* (2006.01)
*H01G 11/24* (2013.01)
(Continued)

(52) U.S. Cl.
CPC ......... *H01G 11/24* (2013.01); *G11C 13/0002* (2013.01); *G11C 13/0016* (2013.01);
(Continued)

(58) Field of Classification Search
CPC .. H01G 2/00; H01G 4/00; H01G 7/06; H01G 9/00; H01G 9/145; H01G 11/24; G11C 13/0002
(Continued)

(56) References Cited

U.S. PATENT DOCUMENTS 8,058,135 B2 * 11/2011 Merker ............... H01G 9/0032
257/E21.011
2007/0212538 A1 9/2007 Niu
(Continued)

FOREIGN PATENT DOCUMENTS

CN 1315139 C 5/2007
CN 1963966 5/2007
(Continued)

OTHER PUBLICATIONS

M. Sathiya, A. S. Prakash, K. Ramesha, JM. Tarascon, and A. K. Shukla V2O5—Anchored Carbon Nanotubes for Enhanced Electrochemical Energy Storage. Sep. 2, 2011 American Chemical Society.*
(Continued)

*Primary Examiner* — William H Mayo, III
*Assistant Examiner* — Hiram E Gonzalez
(74) *Attorney, Agent, or Firm* — Womble Bond Dickinson (US) LLP

(57) ABSTRACT

In one embodiment, a structure for an energy storage device may include a first nanostructured substrate having a conductive layer and a dielectric layer formed on the conductive layer. A second nanostructured substrate includes another conductive layer. A separator separates the first and second nanostructured substrates and allows ions of an electrolyte to pass through the separator. The structure may be a nanostructured electrolytic capacitor with the first nanostructured substrate forming a positive electrode and the second nanostructured substrate forming a negative electrode of the capacitor.

28 Claims, 6 Drawing Sheets

(51) Int. Cl.
*G11C 13/00* (2006.01)
*H01L 49/02* (2006.01)

(52) U.S. Cl.
CPC ............ *H01L 28/82* (2013.01); *Y02E 60/13* (2013.01); *Y10T 29/435* (2015.01)

(58) Field of Classification Search
USPC ................... 361/792, 25.03, 271, 500, 782
See application file for complete search history.

(56) References Cited

U.S. PATENT DOCUMENTS

| | | | |
|---|---|---|---|
| 2010/0008021 A1* | 1/2010 | Hu et al. ................. | 361/502 |
| 2010/0216023 A1 | 8/2010 | Wei et al. | |
| 2011/0002088 A1 | 1/2011 | Aoyama et al. | |
| 2011/0149473 A1* | 6/2011 | Eilertsen ............. | H01G 11/24 361/502 |
| 2011/0170236 A1* | 7/2011 | Young ..................... | 361/502 |
| 2012/0300368 A1 | 11/2012 | Matsuura et al. | |
| 2013/0059174 A1* | 3/2013 | Zhamu ................... | 429/50 |

FOREIGN PATENT DOCUMENTS

| | | |
|---|---|---|
| WO | WO 2011123135 A1 * | 10/2011 |
| WO | WO 2011/123135 | 11/2011 |

OTHER PUBLICATIONS

"PCT Int'l. Search Report and Written Opinion for PCT/US2013/047419, dated Sep. 27, 2013 (13pp)", (Sep. 27, 2013).

Joe W.McPherson et al., "Trends in the Ultimate Breakdown Strength of High Dielectric-Constant Materials", IEEE Transactions of Electron Devices, vol. 50, No. 8, Aug. 2003, pp. 1771-1778.

Office Action from related Taiwan Application No. 102142476, dated Feb. 11, 2015, including Search Report of R.O.C. in English. 22 pages total.

Office Action from related Taiwan Application No. 102142476, dated Jun. 26, 2015, 5 pages total.

International Preliminary Report on Patentability dated Jul. 9, 2015, for international Patent Application No. PCT/US2013/047419, 9 pages.

* cited by examiner

NANOSTRUCTURED ELECTROLYTIC ENERGY STORAGE DEVICES

TECHNICAL FIELD

The disclosed embodiments of the invention relate generally to energy storage devices, and relate more particularly to nanostructured electrolytic capacitors.

BACKGROUND

Energy storage devices, including batteries and capacitors, are used extensively in electronic devices. In particular, capacitors are widely used for applications ranging from electrical circuitry and power delivery to voltage regulation and battery replacement. As capacitor technology has continued to develop, several types have emerged. For example, electric double-layer capacitors (EDLCs), also referred to as ultracapacitors (among other names), are characterized by high energy storage and power density, small size, and low weight and have thus become promising candidates for use in several applications. The total energy that an electrochemical capacitive device can store is often determined by the useful surface area of the device, the spacing between the accumulated charges, the permittivity of the intervening dielectric material, and the square of the voltage of the device. Conventional electrochemical capacitors are limited in their voltage range to just a few volts depending on the electrolyte and electrode used.

Conventional capacitors currently are formed using thicker dielectrics to prevent electrical breakdown and leakage at a high cost to the overall capacitance. Electrolytic capacitors in common use are prepared electrolytically using either aluminum or tantalum. This process is not easily transferable to high specific surface area electrodes. Tantalum capacitors have generally better performance, but at a higher price. Additionally, most electrolytic capacitor technology is focused on ultra-high voltage applications requiring very thick (thousands of nm) dielectric layers.

BRIEF DESCRIPTION OF THE DRAWINGS

The disclosed embodiments will be better understood from a reading of the following detailed description, taken in conjunction with the accompanying figures in the drawings in which.

Figure 1:
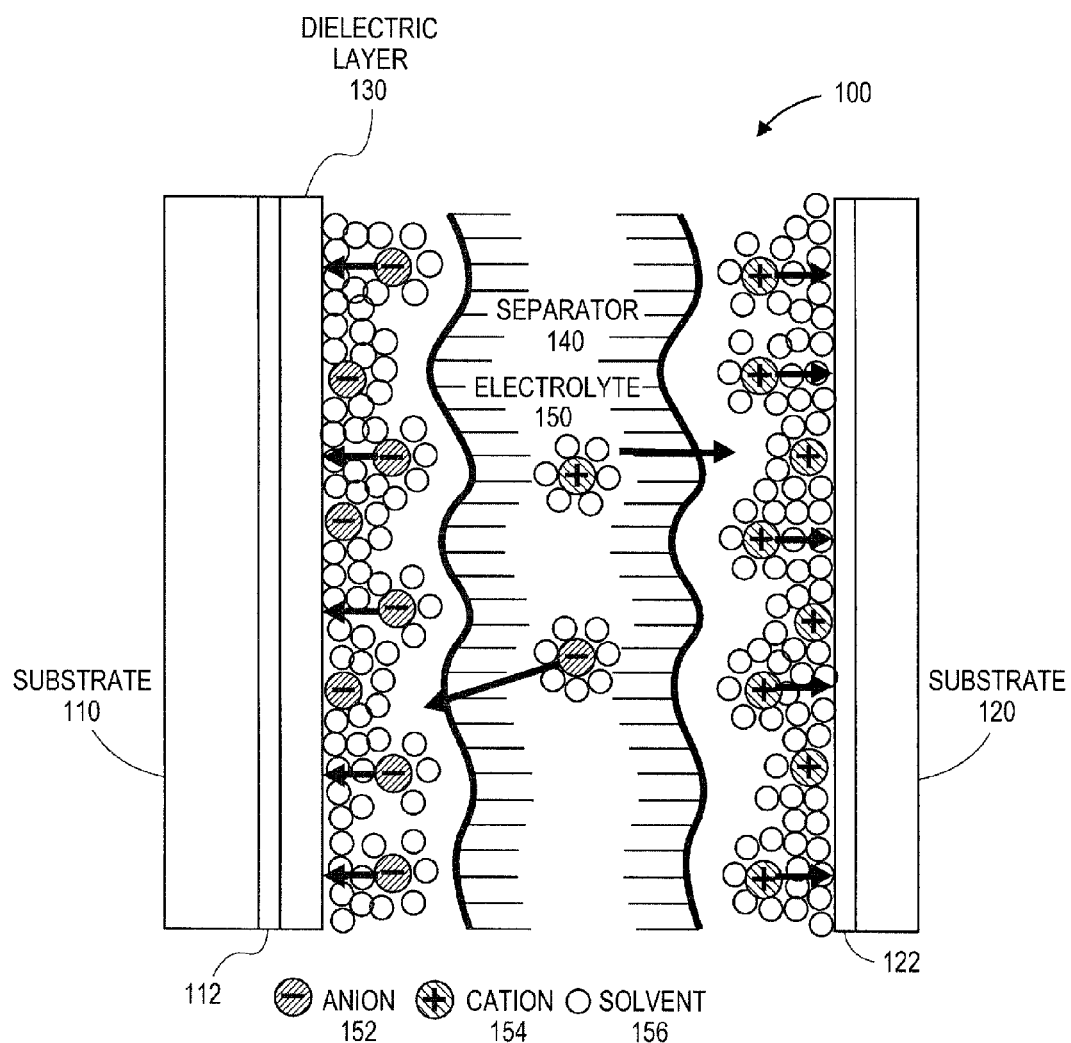
FIG. 1 is a cross-sectional view of a nanoscopic asymmetric structure 100 according to an embodiment of the present invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements, while similar reference numerals may, but do not necessarily, denote similar elements.

DETAILED DESCRIPTION

In one embodiment, a structure for an energy storage device may include a first nanostructured substrate having a conductive layer and a dielectric layer formed on the conductive layer. A second nanostructured substrate includes another conductive layer. A separator separates the first and second nanostructured substrates and allows ions of an electrolyte to pass through the separator. The structure may be a nanostructured electrolytic capacitor with the first nanostructured substrate forming a first electrode (e.g., positive electrode) and the second nanostructured substrate forming a second electrode (e.g., negative electrode) of the capacitor.

Nanostructured electrolytic capacitors can be integrated into devices (e.g., silicon devices) or onto packages to provide energy storage with a rapid response. The nanostructured electrolytic capacitors can be used with batteries. In contrast to batteries, the nanostructured electrolytic capacitors can be charged and discharged quickly without degrading significantly over their lifetime. Nanostructured electrolytic capacitors are also less sensitive to temperature than batteries.

Referring now to the drawings, FIG. 1 is a cross-sectional view of a nanoscopic asymmetric structure 100 according to an embodiment of the present invention. The structure 100 includes a first nanostructured substrate 110. The substrate 110 includes a conductive layer 112 to form a first electrode (e.g., positive electrode, anode). A dielectric layer 130 is disposed on the conductive layer 112. A nanostructured substrate 120 includes a second conductive layer 122 to form a second electrode (e.g., negative electrode, cathode). A separator 140 (e.g., a porous separator having a thickness of 2-10 microns) separates the nanostructured substrates and allows ions of an electrolyte 150 to pass through the separator. The solvent 156 can also pass through the separator. The ions may include anions 152 or cations 154. An anion is an ion with more electrons than protons giving it a net negative charge while a cation is an ion with more protons than electrons giving it a net positive charge. The electrolyte repairs and thickens the dielectric layer 130 locally as required based on a leakage current of the dielectric layer 130. The separator may electrically insulate the first electrode from the second electrode.

A method to simultaneously improve the voltage range and increase the energy capacity simultaneously of an energy storage device (e.g., nanostructured electrolytic capacitor), with the consequence of lowering the capacitance, is to incorporate a dielectric layer on the first electrode (e.g., positive electrode) thereby introducing another capacitor in series with the two electric double layer capacitors.

The structure 100 may be a nanostructured electrolytic capacitor with the nanostructured substrate 110 forming a first electrode (e.g., positive electrode) and the nanostructured substrate 120 forming a second electrode (e.g., negative electrode) of the structure. An electric double layer may be created by the presence of the electrolyte when the nanostructured electrolytic capacitor is in operation. The dielectric layer 130 and the electric double layer collectively form three capacitances in series.

At least one of the first and second nanostructured substrates may include at least one of silicon, silicon carbide, germanium, carbon, tin, and any other material used to make porous materials, nanopillars, sheets, or meshes. The first dielectric layer may be a high-k dielectric layer. As used herein, the phrase "high-k" refers to materials (e.g., $Al_2O_3$, $TiO_2$, $HfO_2$, $HfSiO_x$, $HfAlO_x$, $Nb_2O_5$, $Ta_2O_5$, $VO_x$, perovskite oxides such as $SrTiO_3$, $(Ba, Sr)TiO_3$, $LiNbO_3$, $Bi_4Ti_3O_{12}$, etc) having a dielectric constant, k, greater than that of silicon dioxide, that is, greater than about 4. The first electrode (e.g., positive electrode) includes a high-k oxide film that can be formed by atomic layer deposition (ALD) growth, super critical flow growth or hydro thermal growth onto a porous substrate (e.g., porous silicon substrate or other material as described herein). The oxide film can be designed for different applications including low or high voltage break down (e.g., up to 500 volts) during operation of the nanostructured electrolytic capacitor. The second electrode (e.g., negative electrode) includes a suitably matched conductive coating that can be deposited by ALD ($TiN_x$, $Ti_xAl_yN_z$, $VN_x$, $NbN_x$, $MoN_x$, $TiC_x$, $ZrC_x$, $HfC_x$, $VC_x$, $NbC_x$, $TaC_x$, $WC_x$, $TiSi_x$, $NiSi_x$, $CoSi_x$, Mo, W, Pt, Ru, etc.), supercritical flow growth, or electroplated (Ni, Co, Cu, Pd, Au, etc.) onto a porous substrate or by carbonization of the porous substrate (e.g., porous silicon substrate). At least one of the nanostructured substrates 110 and 120 may be formed using a conductive polymer, a metal foam, or other carbon based materials having a large surface area.

The conductive layer 122 may include a pseudocapacitive material. Depending on the electrochemical window between the dielectric and electrolyte being used, a pseudocapacitive material (e.g., $RuO_2$, $MnO_2$, $V_2O_5$, $NiO_x$, $CoO_x$, etc.) can be formed on the second electrode (e.g., negative electrode) can be used to further improve its specific capacity.

An important design parameter is to control the overall device voltage by manipulating the thickness of a selected dielectric layer (e.g., dielectric layer 130), which determines the breakdown voltage for this dielectric capacitor. In contrast to a metal insulator metal (MIM) capacitor, embodiments of the invention are characterized by dielectric stress that is more uniform and can withstand higher field strengths, within approximately 80% of their ideal breakdown strength, because the capacitor electrolyte continues the healing work of the original formed electrode. The electrolyte repairs and thickens the dielectric locally as required. This healing process is driven by the capacitor's DC leakage current at the pin holes and other defects in the dielectric layer. The DC leakage current is drawn whenever a DC voltage is applied to the capacitor, that is, whenever it is in operation. Even for very thin dielectric materials deposited on a porous structure, the breakdown voltage is higher than its MIM structure counterpart mainly because of the fact that there are no electron charge accumulations on both sides. Therefore, the present design greatly reduces tunneling electrons and therefore improves the onset of dielectric breakdown voltage.

The nanostructured electrolytic energy storage device of the present disclosure may have three capacitors in series. The electric double layer capacitors (EDLC) provide 2 capacitors (i.e., 1 from a negative electrode and 1 from a positive electrode) and the third capacitor is based on the deposited dielectric layer (e.g., on first electrode, positive electrode). Constrained by this serial arrangement of capacitors, the voltage drop on each component capacitor is determined by their respective capacitance with a larger capacitance corresponding to a smaller voltage drop. A thicker dielectric material enables a higher breakdown voltage operation. In general, the breakdown voltage is proportional to a thickness of the dielectric material. The thickness of dielectric will be limited by the geometry of the nanostructures/pores described in the present disclosure. In addition, all three capacitors need to be designed properly to make sure all voltage drops on each capacitor are safe for its respective breakdown voltage (or electrochemical window for EDLC component). For example, in calculations of the present design, if a 2.5 nm thick dielectric film (such as $TiO_2$, designed for 1.3 V) is formed on the positive electrode, a higher specific energy can be achieved than with porous Si EDLC. In theory for a MIM capacitor, $Al_2O_3$ has a breakdown of 1.38 V/nm, $HfO_2$ has a breakdown of 0.67 V/nm, $Ta_2O_5$ has a breakdown of 0.37 V/nm, and $SrTiO_3$ has a breakdown of 0.23 V/nm. In the present design with a dielectric formed on the positive electrode, experimental results indicate that $Al_2O_3$ has a breakdown of 0.6 V/nm, $HfO_2$ has a breakdown of 0.55 V/nm, $Ta_2O_5$ has a breakdown of 0.2 V/nm, and $SrTiO_3$ has a breakdown of 0.13 V/nm. The experimental results have lower breakdown values in comparison to theoretical results based typically on defects in the dielectric.

By selecting the proper dielectric material with dielectric constant values greater than the electrolyte, the overall device operation voltage and energy storage capacity can be improved significantly (e.g., by 33%) compared to a conventional porous silicon electrochemical capacitor using the same pore structure and same conductive coating thickness for both electrodes. The higher voltage can be achieved by further increasing the dielectric thickness using large pore size porous silicon (e.g., from 30 nm to 3 um diameters). However, the energy capacity may not improve simultaneously because of the decrease of the overall capacitance due to the lower useful surface associated with larger pores. To further clarify, the increase in operation voltage is due to the fact that some of the voltage drop (e.g., approximately 90%) is across the dielectric layer allowing the total voltage of the device to be higher than the electrochemical window of the electrolyte. The possible decrease in energy (for higher voltage application) and capacitance may be acceptable for some applications due to the need to achieve a certain operating voltage.

In at least some embodiments of the invention, nanoscopic porous material is used to form an electrolytic capacitor with high voltage and large surface area simultaneously in accordance with the present disclosure. Unlike current electrolytic capacitor technology, embodiments of this invention bridge the device technology spanning the performance advantage of a conventional EDLC device and a conventional electrolytic capacitor. Additionally, this device can be integrated monolithically onto microchips or in a package, which is not possible in current electrolytic capacitor storage devices.

In an embodiment, the dielectric layer includes an anodic oxide dielectric, which is polar. Thus, the electrolytic capacitors are also polar (in contrast with the classical electrostatic capacitors). That is, for this embodiment, the capacitors must be connected with the correct polarity as marked. Otherwise, connecting with reverse voltage injects hydrogen ions through the oxide readily, causing high electrical conduction, heating and reduction of the anodic oxide film.

In other embodiments, non-polar (i.e., uni-polar or bi-polar) devices can be made by using two anodes instead of an anode and a cathode, or the positives or negatives of two identical devices can be connected together. Then, the other two terminals would form a non-polar device.

Figure 2:
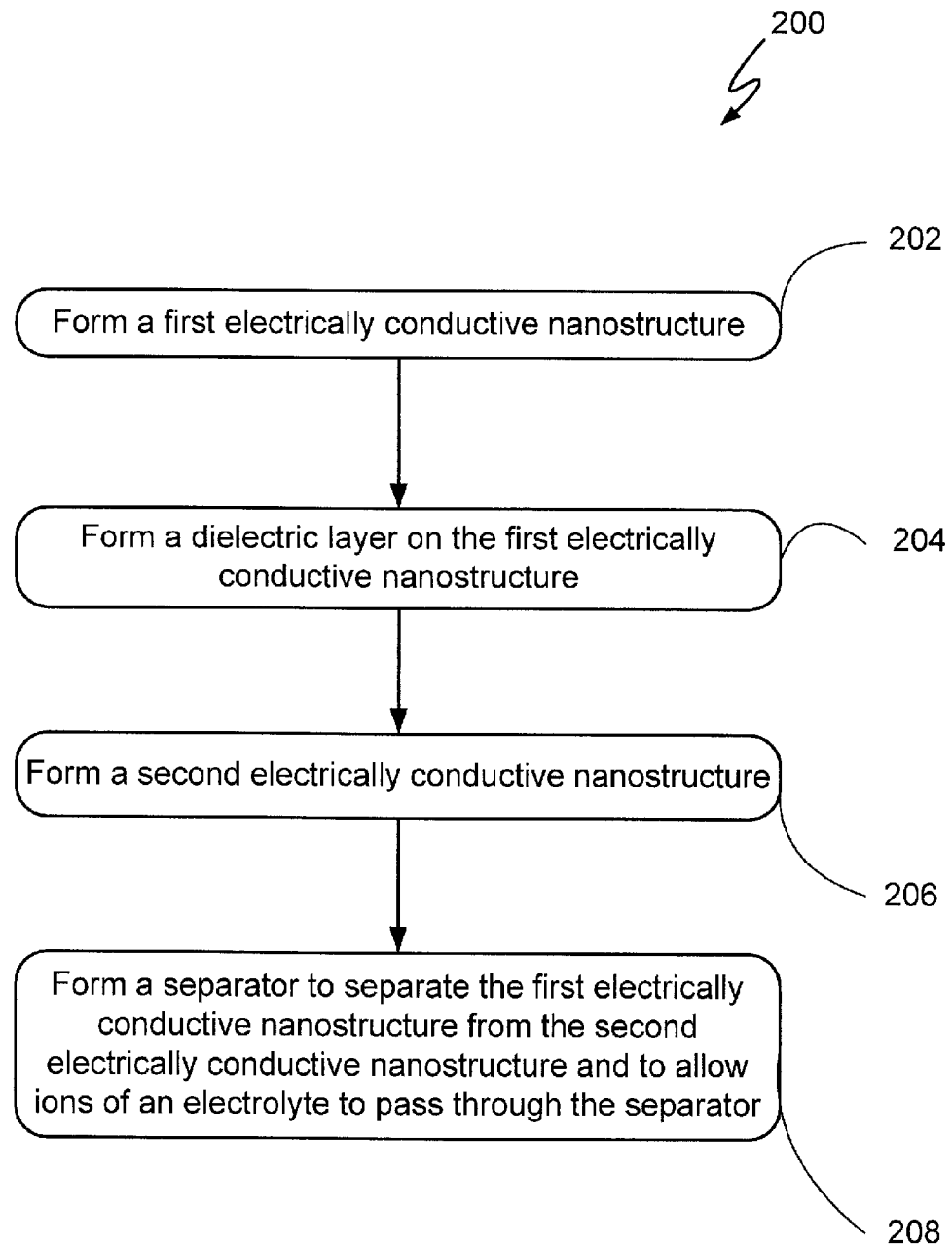
FIG. 2 is a flow diagram 200 representing a method for constructing a nanostructured electrolytic capacitor according to one embodiment of the present invention.

FIG. 2 is a flow diagram 200 representing a method for constructing a nanostructured electrolytic capacitor according to one embodiment of the present invention. At block 202, the method 200 may include forming a first electrically conductive nanostructure. In one embodiment, the electrically conductive nanostructure is formed by anodic etching of a substrate (e.g., silicon, SiC) or any other process known in the field of forming deep pores (e.g., micron deep) with nanometer wide diameters (e.g., up to 100 nanometers wide). An electrically conductive layer can be deposited on the substrate having nanoscopic pores.

At block 204, the method 200 includes forming a dielectric layer (e.g., high-K oxide film, SiOx, etc.) on the first electrically conductive nanostructure. A high-K oxide film (e.g., $Al_2O_3$, $TiO_2$, $HfO_2$, $HfSiO_x$, $HfAlO_x$, $Nb_2O_5$, $Ta_2O_5$, $VO_x$, perovskite oxides such as $SrTiO_3$, $(Ba, Sr)TiO_3$, $LiNbO_3$, $Bi_4Ti_3O_{12}$, etc.) can be formed by ALD growth, supercritical flow growth, or hydrothermal growth onto the first electrically conductive nanostructure (e.g., positive electrode). The oxide film is also designed to have a high voltage breakdown. At block 206, the method includes forming a second electrically conductive nanostructure by anodic etching of a substrate (e.g., silicon, SiC) or any other process known in the field of forming deep pores (e.g., tens of microns deep) with nanometer wide diameters. The second electrically conductive nanostructure (e.g., negative electrode) can be formed with a suitably matched conductive coating that is deposited by ALD ($TiN_x$, $Ti_xAl_yN_z$, $VN_x$, $NbN_x$, $MoN_x$, $TiC_x$, $ZrC_x$, $HfC_x$, $VC_x$, $NbC_x$, $TaC_x$, $WC_x$, $TiSi_x$, $NiSi_x$, $CoSi_x$, Mo, W, Pt, Ru, etc.), supercritical flow growth, or electroplated (Ni, Co, Cu, Pd, Au, etc.) onto a porous silicon substrate or by carbonization of the porous silicon substrate. The substrate may be formed using a conductive polymer, a metal foam, or other carbon based materials having a large surface area. The second electrically conductive nanostructure may include a pseudocapacitive material to further improve the device voltage and capacity. In one embodiment, the first and second electrically conductive nanostructures are formed with matching (i.e., the same type of) electrically conductive layers.

At block 208, the method includes forming a separator to separate the first electrically conductive nanostructure from the second electrically conductive nanostructure and to allow ions of an electrolyte to pass through the separator. For example, the first and second electrically conductive nanostructures may be bonded together face-to-face with an intervening separator. The first electrically conductive nanostructure may be a positive electrode and the second electrically conductive nanostructure may be a negative electrode of an energy storage device. An electric double layer may be created by the presence of the electrolyte when the energy storage device is in operation. The electrolyte repairs and thickens the dielectric layer locally as needed based on a leakage current of the dielectric layer. The dielectric layer is formed on the first electrically conductive nanostructure (e.g., positive electrode) to increase voltage on a large surface area and nanometer scale. For example, with 20 nm wide pores etched into the substrate, a large surface area (e.g., hundreds of square meters of surface area/cubic centimeter) material without a high level of surface area variance over a 100 micron thick plate may be produced.

By varying the porous material pore size, the material selection for the electrode coating, and the choice of electrolyte, the device can be designed to meet specific applications for higher voltage, higher capacity, or higher power. Three dimensional structures can be formed that allow for electrodes in asymmetrical morphologies, such as pore size, surface area, or depth, to maximize the operating voltage window of the device without surpassing the breakdown voltage of the electrolyte and dielectric layer.

Figure 3:
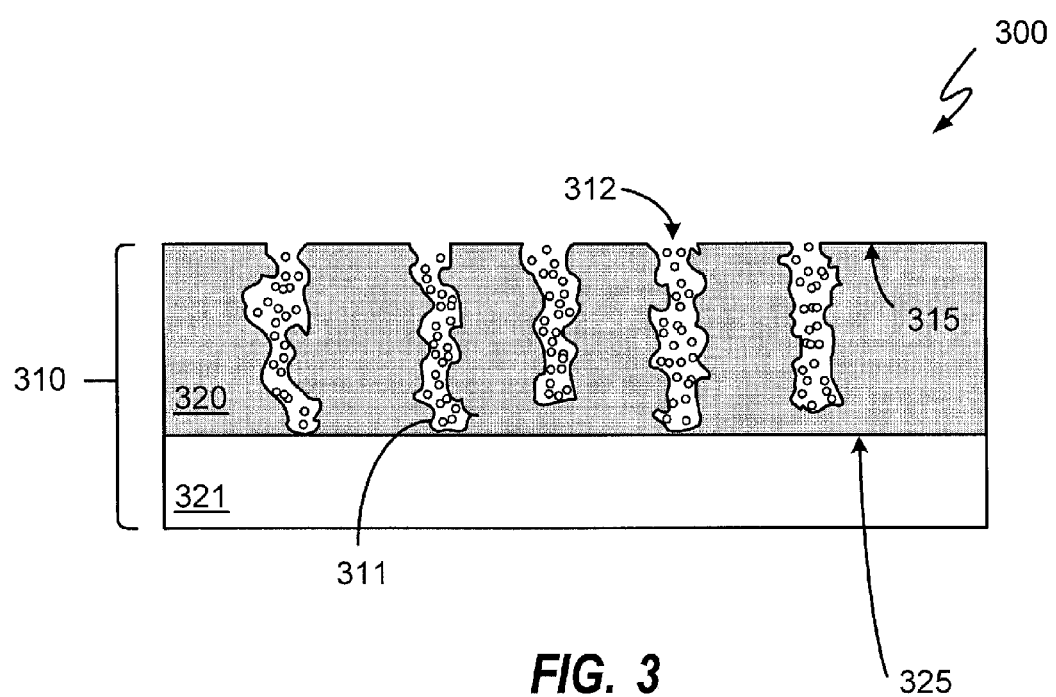
FIG. 3 is a cross-sectional view of a porous structure according to an embodiment of the present invention.

FIG. 3 is a cross-sectional view of a porous structure 300 according to an embodiment of the present invention. Porous structure 300 includes porous layer 320 with multiple channels 311 within a Silicon (Si) substrate 310 (e.g., any Silicon substrate with good conductivity including single-crystal, mono-crystal, poly-crystal, and amorphous silicon). The shaded region 320 distinguishes the porous layer from the non-porous layer 321. The substrate material in the shaded region 320 may be the same material as the non-shaded region 321. In one embodiment, the non-shaded region may be removed or reduced in thickness to minimize its size for implementation in a compact device. The porous layer boundary 325 represents the average pore depth of an array of channels within Si substrate. In one embodiment, each channel may have an opening 312 to a porous surface 315 of the Si substrate 310. In other embodiments, the substrate may be formed with different manufacturing techniques and may include different materials (e.g., carbon). For example, compacted active carbon may not have an opening to a surface of the substrate.

In one embodiment, the substrate may include silicon, silicon carbide, germanium, carbon, tin, or any other material that can be etched to make porous materials having a large surface area. Possible advantages of using silicon include its compatibility with existing silicon technology. Germanium enjoys a similar advantage as a result of existing technology for that material and, as compared to silicon, enjoys the further possible advantage that its native oxide (germanium oxide) is water-soluble and so is easily removed. (The native oxide that forms on the surface of silicon may trap charge—which is an undesirable result.) Germanium is also highly compatible with silicon technology. Possible advantages of using tin, which is a zero-band-gap material, include its enhanced conductivity with respect to certain other conductive and semiconductive materials. Other materials may also be used for the porous structure, including silicon carbide, alloys such as an alloy of silicon and germanium, and metals such as copper, aluminum, nickel, calcium, tungsten, molybdenum, and manganese. A silicon-germanium alloy, for example, will advantageously exhibit a much smaller volume difference than a pure germanium structure.

With the right etchant, it should be possible to make porous structures having the described characteristics from a wide variety of materials. As an example, a porous silicon structure may be created by etching a silicon substrate with a mixture of hydrofluoric acid (HF) and alcohol (ethanol, methanol, isopropyl, etc.). More generally, porous silicon and other porous structures may be formed by such processes as anodization and stain etching.

In certain embodiments, the smallest dimension of each one of the channels is a few nanometers or tens of nanometers. This upper size limit for the smallest dimension of the channels may be chosen for particular embodiments in order to maximize the surface area of the porous structures of those embodiments. Smaller (e.g., narrower) channels lead to increased overall surface area for each electrically conductive structure because a larger number of such narrower channels can fit into an electrically conductive structure of a given size. Because capacitance is proportional to surface area, channels constrained in size in the manner described would likely, and advantageously, result in capacitors with increased capacitance. (The channels' other dimensions, e.g., their lengths, may also be manipulated in order to increase surface area (or to achieve some other result)—i.e., longer channels may be preferred over shorter ones—but otherwise are likely to be less critical than the smallest dimension discussed above.)

Figure 4:
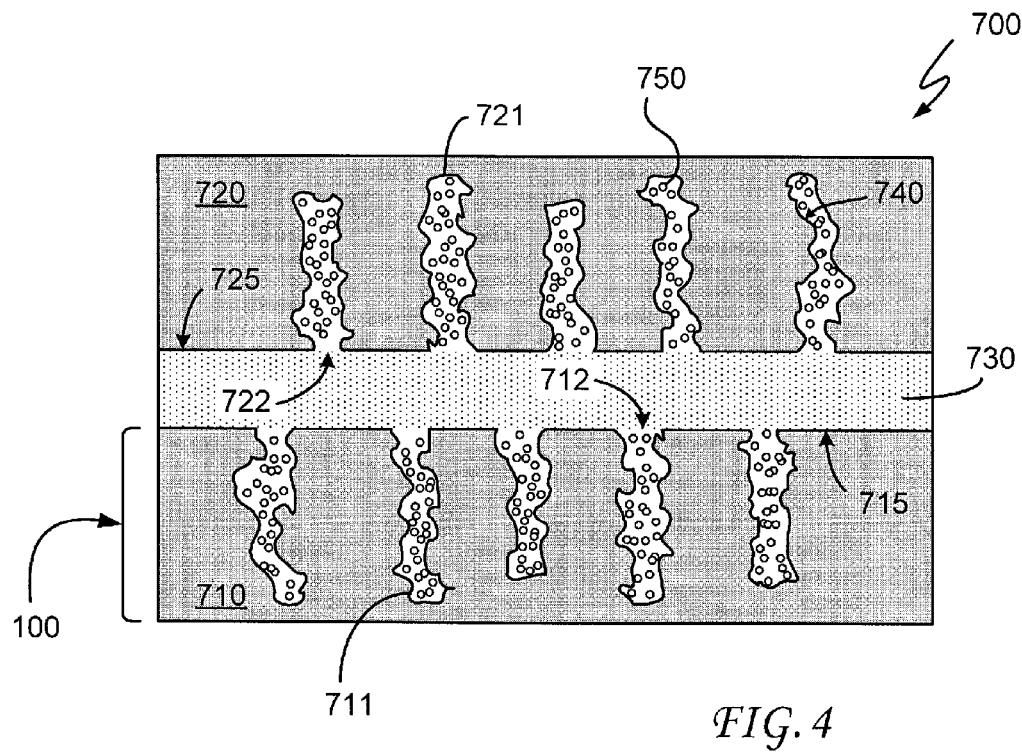
FIGS. 4 and 5 are cross-sectional views of a energy storage device according to embodiments of the present invention.
Figure 5:
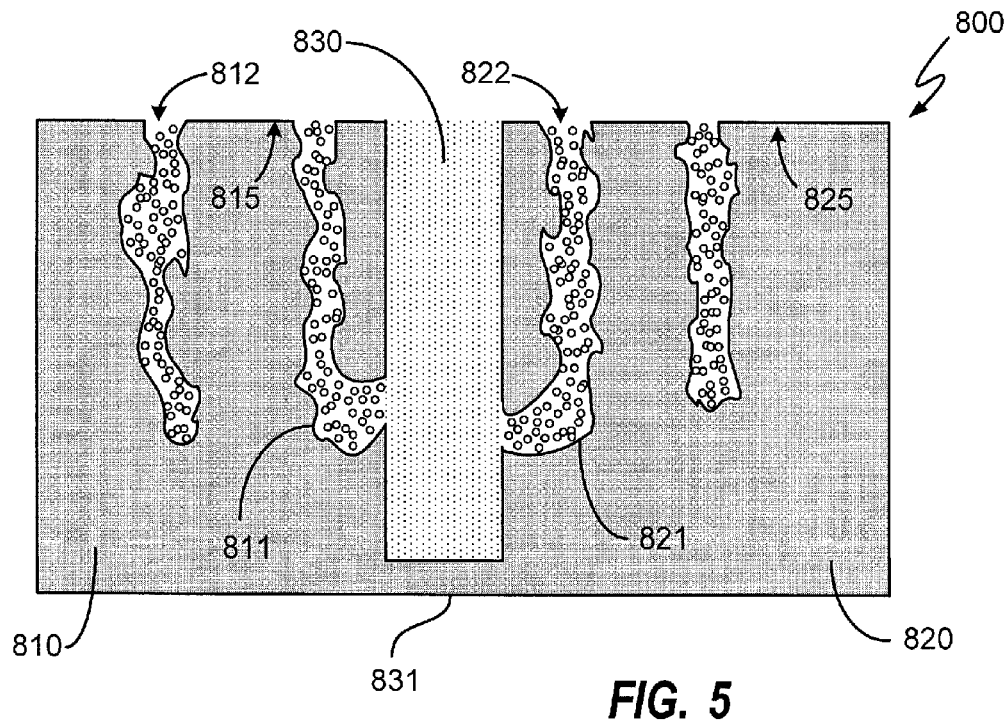

FIGS. 4 and 5 are cross-sectional views of an energy storage device according to an embodiment of the present invention. As illustrated in FIGS. 4 and 5, energy storage device 700 includes a Si substrate 710 and a Si substrate 720 separated from each other by an electrical insulator (e.g., separator). This electrical insulator could take one of various forms, as discussed in more detail below. At least one of Si substrates 710 and 720 includes a porous structure 300 (as shown in FIG. 3 but with a majority of the non-porous layer 321 removed) containing multiple channels 711. In the illustrated embodiments, both Si substrate 710 and Si substrate 720 include such a porous structure. Accordingly, Si substrate 710 includes channels 711 with openings 712 to a surface 715 of the corresponding porous structure, and Si substrate 720 includes channels 721 with openings 722 to a surface 725 of the corresponding porous structure. In an embodiment where only one of Si substrates 710 and 720 includes a porous structure with multiple channels, the other electrically conductive structure can be, for example, a metal electrode or a non-porous silicon structure.

Various configurations of energy storage device 700 are possible. In the embodiment of FIG. 4, for example, energy storage device 700 includes two distinct porous structures (Si substrate 710 and Si substrate 720) that have been bonded together face-to-face with an intervening separator 730. As another example, in the embodiment of FIG. 5 energy storage device 800 includes a single planar porous structure in which a first section (Si substrate 810) is separated from a second section (Si substrate 820) by a trench 831 containing separator 830. One of the electrically conductive structures will be the positive side and the other electrically conductive structure will be the negative side. Separator 830 permits the transfer of ions but does not allow the transfer of fluid such as would be found in an electrolyte.

FIG. 5 shows a small bridge of material connecting Si substrate 810 and Si substrate 820. If left unaddressed, this bridge may act as an electrical short between the two electrically conductive structures. There are several possible solutions, however. For example, the bridge may be removed using a polishing operation. Alternatively, the electrically conductive structures may be formed in a heavily-doped top layer or region of a wafer while the trench extends down to an underlying lightly-doped substrate that is not a very good conductor. In another embodiment, a silicon-on-insulator structure may be used.

As an example, the porous structure of Si substrates 810 and 820 can be created by a wet etch process in which a liquid etchant applied to a surface of the electrically conductive structures etches away portions of the electrically conductive structure in a way that is at least somewhat similar to the way water is able to carve channels in rock. This is why each one of the channels formed in this way has an opening to the surface of the electrically conductive structure; the wet etch method is incapable of creating fully-enclosed cavities, i.e., cavities with no opening to the surface, like an air bubble trapped inside a rock, within the porous structure. This is not to say that those openings cannot be covered with other materials or otherwise closed up because of the presence of or addition of other materials—that is in fact likely to occur in several embodiments—but, whether covered or not, the described openings to the surface are a feature of each channel in each porous structure according to at least one embodiment of the invention. (One embodiment in which the openings may be covered up is one in which a layer of epitaxial silicon as a location for circuitry or other wiring is grown on top of the channels). Porous structures according to embodiments of the invention can be fabricated with very precise and uniform pore size control (in contrast to active carbon). This allows fast charging (pore size may be optimized in order to be compatible with the size of the ions) and also improves the capacitance (no area will be malfunctioning). This would also allow narrow distribution of voltage fluctuation.

It should be noted in connection with this discussion that porous carbon, being formed in a manner different from that described above, has a different structure—one that is characterized by fully-enclosed cavities having no surface openings. As a result, porous carbon is not suitable—or at least not as desirable—for at least certain embodiments of the invention (although it should be mentioned here that certain other embodiments (such as, for example, the thick electrically conductive structure described below) may contain fully-enclosed cavities). It should also be noted that the FIG. 4 and FIG. 5 depictions of the porous structures are highly idealized in that, to mention just one example, all of channels 811 and 821 are shown as only extending vertically. In reality the channels would branch off in multiple directions to create a tangled, disorderly pattern.

In one embodiment, energy storage device 700 further includes an electrically conductive coating 740 on at least a portion of the porous structure and in at least some of channels 711. Such an electrically conductive coating may be necessary in order to maintain or enhance the conductivity of the porous structure. As an example, electrically conductive coating 740 may include graphene in one embodiment of the present invention. This material may be applied using processes such as ALD. The layer of graphene may passivate a surface of a pore channel and convert the surface into highly conductive plates. Energy storage device 800 may include an electrically conductive coating 840 on at least a portion of the porous structure and in at least some of channels 811.

As another example, electrically conductive coating 740 may be a coating of metal such as, for example, aluminum, copper, and tungsten, or other electrical conductors such as tungsten nitride, titanium nitride, and tantalum nitride. Each of the listed materials has the advantage of being used in existing CMOS technology. Other metals such as nickel and cobalt may also be used as electrically conductive coating 740 or 840. These materials may be applied using processes such as electroplating, chemical vapor deposition (CVD), and/or atomic layer deposition (ALD). It should be noted here that a CVD process of tungsten is self-limiting, meaning that the tungsten will form a couple of monolayers and then stop growing. The resulting thin electrically conductive coating is exactly what is needed for embodiments of energy storage device 700 or 800 because it never gets so thick as to seal off the channels and prevent the CVD gas from penetrating deeper into the channels. If desired, the porous structure can also be doped with a dopant designed to increase the electrical conductivity of the structure (boron, arsenic, or phosphorus, for example, for porous silicon; arsenic or gallium, for example, for porous germanium).

In an alternative embodiment, the electrical insulator, which may be a different form of separator 730, separating electrically conductive structure 710 from substrate 720 includes a dielectric material. For example, one could make a very high-capacitance capacitor using a porous silicon electrode oxidized with silicon dioxide ($SiO_2$) along with a porous silicon, metal, or polysilicon structure as the other electrode. The very high surface area of the porous silicon would be a major contributor to the high capacitance that could be achieved with such a capacitor. In certain embodiments, the separator is a physical separator for separating the structures or substrates of a capacitor. The capacitance could be increased still further—even significantly increased—by placing an electrolyte 750 in physical contact with the porous structure. Electrolyte 750 (as well as other electrolytes described herein) is represented in the drawings using a random arrangement of circles. This representation is intended to convey the idea that the electrolyte is a substance (liquid or solid) containing free ions. The circles were chosen for convenience and are not intended to imply any limitation as to the electrolyte components or qualities, including any limitation with respect to the size, shape, or number of the ions. A typical, though not the only, type of electrolyte that may be used in accordance with embodiments of the invention is an ionic solution.

Figure 6:
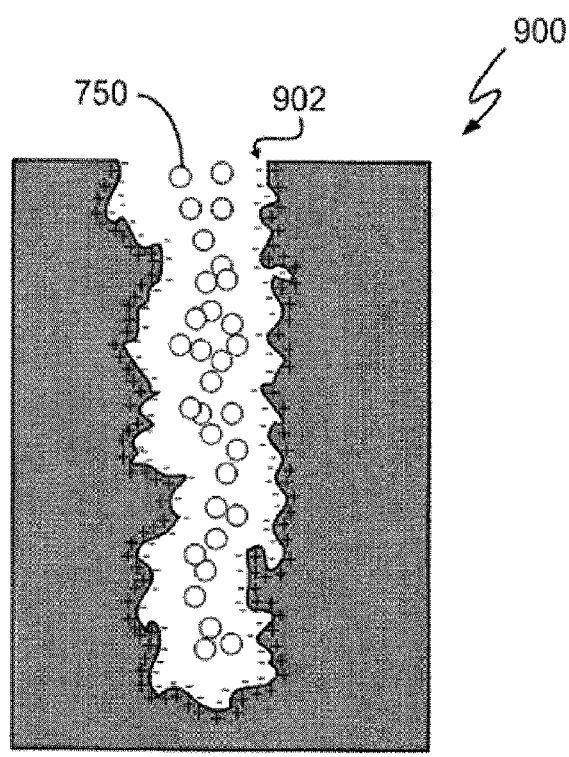
FIG. 6 is a cross-sectional representation of an electric double layer within a channel of a energy storage device according to an embodiment of the present invention.

In another embodiment, where electrolyte 750 is used, the electrical insulator (e.g., separator 730) separating Si substrate 710 from Si substrate 720 can be an electric double layer that is created by the presence of the electrolyte. This electric double layer, depicted schematically in FIG. 6, can complement or replace the dielectric material described above. As illustrated in FIG. 6, an electrical double layer (EDL) 902 has been formed within one of channels 711. EDL 902 is made up of two layers of ions, one of which is the electrical charge of the sidewalls of channel 711 (depicted as being positive in FIG. 6 but which could also be negative) and the other of which is formed by free ions in the electrolyte. EDL 902 electrically insulates the surface, thus providing the charge separation necessary for the capacitor to function. The large capacitance and hence energy storage potential of electrolytic ultracapacitors arises due to the small (approximately 1 nm) separation between electrolyte ions and the electrode. It should be noted that when energy storage device 700 is discharged then the EDL dissipates. Ideally, all EDLC, with two electrodes separated by a selected electrolyte, are electrically isolated/insulated regardless of whether the electrodes are being charged or not. However, in practice, an additional separator may be inserted between the two electrodes in order to improve isolation and to prevent any physical contact between the two electrodes. For example, by mechanical force or any cause, the electrolyte could be squeezed out locally and cause the two electrodes to be in contact physically.

The electrolyte for the above capacitor devices needs high ionic conductivity to lower the equivalent series resistance (ESR). In some embodiments, electrolytes can be aqueous based electrolytes (e.g., $H_2SO_4$ based) with high ionic conductivity. However, one can also use either aqueous, organic, ionic liquid electrolyte based approach or use a co-solvent approach to optimize the overall device performances or for special application requiring critical performance of temperature, safety issue, etc.

Electrolytic capacitor technology is generally not utilized for conventional energy storage and also not based on porous silicon (or other porous materials) since these devices are packaged for operation at very high voltages. Additionally, porous silicon and other non-carbon porous materials are typically not utilized in electrochemical energy storage technology. The structures described in this disclosure enable the formation of higher voltage devices in comparison to conventional electrochemical capacitors, but with the retention of some features (e.g., high energy storage) of more conventional electrochemical capacitors.

Figure 7:
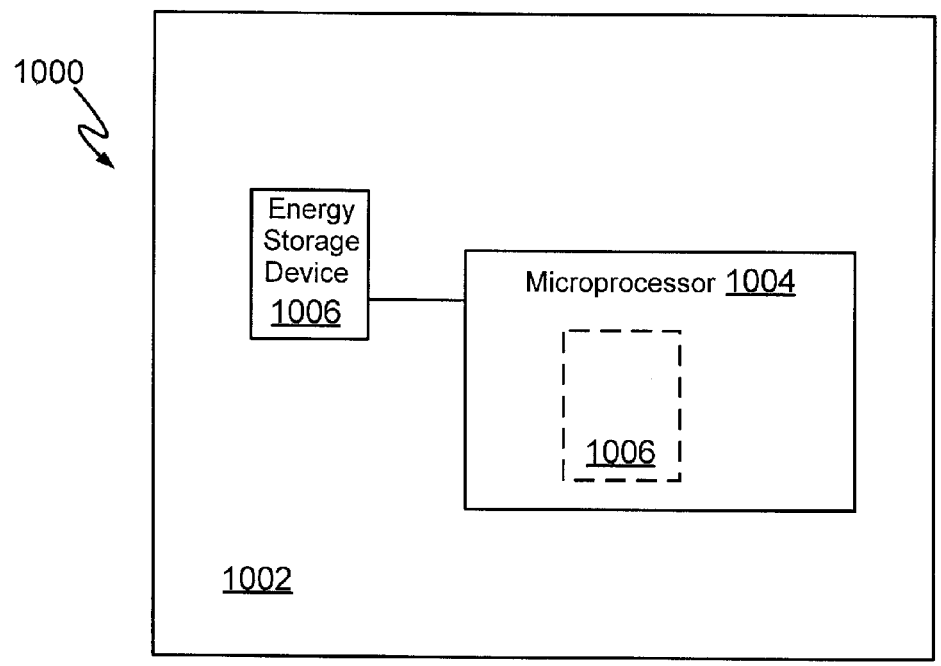
FIG. 7 is a block diagram representing a microelectronic device according to an embodiment of the present invention.

FIG. 7 is a block diagram representing a microelectronic device 1000 according to an embodiment of the invention. As illustrated in FIG. 7, microelectronic device 1000 may include a substrate 1002, a microprocessor 1004 over substrate 1002, and an energy storage device 1006 associated with microprocessor 1004. Energy storage device 1006 can either be located on substrate 1002 away from microprocessor 1004 (e.g., a die-side capacitor), as illustrated in solid lines, or it can be located on microprocessor 1004 itself (e.g., in a build-up layer above the microprocessor), as illustrated in dashed lines. In one embodiment, energy storage device 1006 includes a first electrically conductive nanostructure, a dielectric layer disposed on the first electrically conductive nanostructure, a second electrically conductive nanostructure, and an electrical insulating separator to separate the first electrically conductive nanostructure from the second electrically conductive nanostructure. The energy storage device may include a nanostructured electrolytic capacitor with the first electrically conductive nanostructure forming a positive electrode and the second electrically conductive nanostructure forming a negative electrode of the energy storage device. The electrical insulating separator having good ionic conductivity that is located between two electrodes also include two electric double layers created by the presence of an electrolyte when the nanostructured electrolytic capacitor is in operation. The dielectric layer and the electric double layer collectively form three capacitances in series. The electrolyte repairs and thickens the dielectric layer locally as needed based on a leakage current of the dielectric layer.

In certain embodiments, at least one of the first and second electrically conductive nanostructures includes at least one of silicon, silicon carbide, germanium, carbon, tin, and any other material used to make porous materials, nanopillars, sheets, or meshes. The second electrically conductive nanostructure includes a nanostructured substrate that can be formed using a conductive polymer, a metal foam, or other carbon based materials having a large surface area. The second electrically conductive nanostructure may include a pseudocapacitive material.

As an example, this embodiment can be similar to one or more of the embodiments shown in FIGS. 1-6 and described in the accompanying text. The energy storage device 1006 may include a plurality of nanostructures (e.g., discrete nanostructures) and an electrolyte in physical contact with at least some of the nanostructures.

The energy storage devices disclosed herein may in some embodiments be used as a decoupling capacitor within microelectronic device 1000—one that is smaller and that, for the reasons described elsewhere herein, offers much higher capacitance and much lower impedance than existing decoupling capacitors. As already mentioned, energy storage device 1006 can be part of a support integrated circuit (IC) or chip or it can be located on the microprocessor die itself. As an example, one might, according to embodiments of the invention, be able to form regions of porous silicon (or the like, as described above) on a microprocessor die and then create a high-surface-area embedded decoupling capacitor right on the substrate of the microprocessor die. Because of the porosity of the silicon, the embedded capacitor would have very high surface area. Other possible uses for the disclosed energy storage devices include use as a memory storage element (where problems with the z-direction size of embedded DRAM approaches may be solved by greatly increasing the farads per unit area) or as a component of voltage converters in voltage boost circuitry, perhaps for use with circuit blocks, individual microprocessor cores, or the like.

As an example, higher capacitance values could in this context be advantageous because parts of the circuit could then run nominally at a certain (relatively low) voltage but then in places where higher voltage is needed in order to increase speed (e.g., cache memory, input/output (I/O) applications) the voltage could be boosted to a higher value. An operational scheme of this sort would likely be preferred over one in which the higher voltage is used everywhere; i.e., in cases where only a small amount of circuitry requires a higher voltage it likely would be preferable to boost voltage from a lower baseline voltage for that small portion of the circuit rather than drop voltage from a higher baseline value for the majority of the circuitry. Future microprocessor generations may also make use of voltage converters of the type described here. Having more capacitance available to be deployed around a package or around a microprocessor die may help solve the existing issue of intolerably high inductance between transistors that transfer voltage around a circuit.

Figure 8:
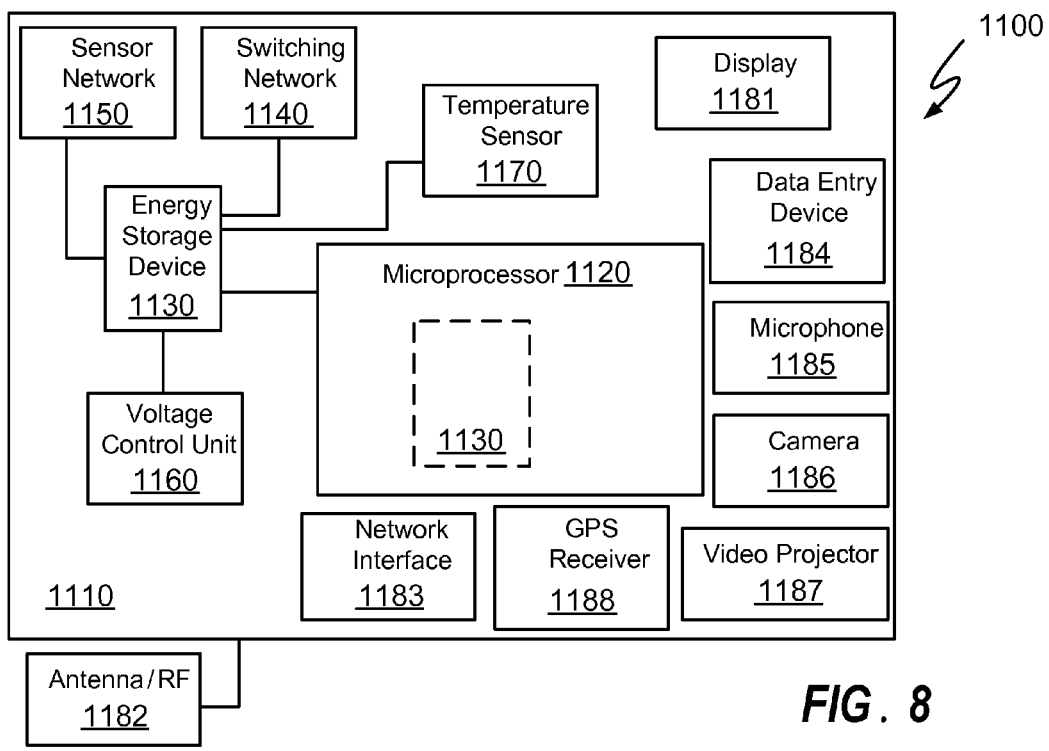
FIG. 8 is a block diagram representing a mobile electronic device according to an embodiment of the present invention.

FIG. 8 is a block diagram representing a mobile electronic device 1100 according to an embodiment of the invention. As illustrated in FIG. 8, mobile electronic device 1100 includes a substrate 1110 on which a microprocessor 1120 and an energy storage device 1130 associated with microprocessor 1120 are disposed. Energy storage device 1130 can either be located on substrate 1110 away from microprocessor 1120, as illustrated in solid lines, or it can be located on microprocessor 1120 itself, as illustrated in dashed lines. In one embodiment, energy storage device 1130 includes a first electrically conductive nanostructure, a dielectric layer disposed on the first electrically conductive nanostructure, a second electrically conductive nanostructure, and a separator to separate the first electrically conductive nanostructure from the second electrically conductive nanostructure. An electric double layer can be created by the presence of an electrolyte when the energy storage device is in operation. The electrolyte repairs and thickens the dielectric layer locally as needed based on a leakage current of the dielectric layer. At least one of the first and second electrically conductive nanostructures may include at least one of silicon, silicon carbide, germanium, carbon, tin, and any other material used to make porous materials, nanopillars, sheets, or meshes. In addition, the second electrically conductive nanostructure can include a nanostructured substrate that is formed using a conductive polymer, a metal foam, or other carbon based materials having a large surface area. The energy storage device 1130 is monolithically integrated with the substrate 1110 of the device 1100. As an example, this embodiment can be similar to one or more of the embodiments shown and described herein.

In at least some embodiments energy storage device 1130 is one of a plurality of energy storage devices (all of which are represented in FIG. 8 by block 1130) contained within mobile electronic device 1100. In one or more of those embodiments mobile electronic device 1100 further includes a switching network 1140 associated with the energy storage devices. When a capacitor is being discharged, it doesn't maintain a constant voltage, but instead decays in an exponential manner (unlike a battery where the voltage stays relatively constant during discharge). Switching network 1140 includes circuitry or some other mechanism that switches in and out various capacitors such that a relatively constant voltage is maintained. For example, the energy storage devices could initially be connected to each other in parallel and then, after a certain amount of voltage decay, a subset of the energy storage devices could be changed by the switching network so as to be connected in series such that their individual voltage contributions can boost the declining overall voltage. In one embodiment switching network 1140 could be implemented using existing silicon device technology as used in the art (transistors, silicon controlled rectifiers (SCRs), etc.), while in other embodiments it could be implemented using micro-electromechanical systems (MEMS) relays or switches (which, it may be noted, tend to have very low resistance).

In some embodiments, mobile electronic device 1100 further includes a sensor network 1150 associated with energy storage device 1130. In at least some embodiments each one of the plurality of energy storage devices will have its own sensor that indicates certain behavioral parameters of the energy storage device. For example, the sensors may indicate existing voltage levels as well as the ongoing discharge response, both of which are parameters that may be used by the switching network—especially in cases where the dielectric material (or other electrical insulator) being used is not linear but rather has a dielectric constant that varies with the voltage. In those cases, it may be advantageous to include along with the sensor network a finite state machine such as a voltage control unit 1160 that knows what the behavior of the dielectric is and responds accordingly. A voltage control unit that knows how the dielectric behaves can compensate for any non-linearity. A temperature sensor 1170 associated with energy storage devices 1130 may also be included in order to sense temperature (or other safety-related parameters). In certain embodiments of the invention, mobile electronic device 1100 further includes one or more of: a display 1181, antenna/RF elements 1182, a network interface 1183, a data entry device 1184 (e.g., a keypad or a touchscreen), a microphone 1185, a camera 1186, a video projector 1187, a global positioning system (GPS) receiver 1188, and the like.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the energy storage devices and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A structure, comprising:
   a first nanostructured substrate having an array of channels with openings to a porous surface of the first nanostructured substrate and a first conductive layer on the array of channels to provide a first electrode;
   a dielectric layer disposed on the first conductive layer;
   a second nanostructured substrate having a second conductive layer to provide a second electrode;
   an electrolyte between the dielectric layer and the second conductive layer; and
   a separator to separate the first and second nanostructured substrates and to pass ions of the electrolyte through the separator to the dielectric layer that is between the separator and the first conductive layer, wherein the dielectric layer is configured to introduce an additional capacitor in series with a first capacitor that is created using the electrolyte and the first electrode and a second capacitor that is created using the electrolyte and the second electrode and to increase a voltage and an energy capacity of the structure.

2. The structure of claim 1, wherein the structure is nanostructured electrolytic capacitor, the first electrode is a positive electrode and the second electrode is a negative electrode.

3. The structure of claim 2, wherein the first capacitor and the second capacitor are electric double layer capacitors.

4. The structure of claim 2, wherein the electrolyte is configured to repair and thicken the dielectric layer locally based on a leakage current of the dielectric layer.

5. The structure of claim 1, wherein at least one of the first and second nanostructured substrates comprises at least one of silicon, silicon carbide, germanium, carbon, or tin.

6. The structure of claim 1, wherein a dielectric constant of the dielectric layer is greater than a dielectric constant of the electrolyte.

7. The structure of claim 1, wherein at least one of the first and the second nanostructured substrates is formed using a conductive polymer, or a metal foam.

8. The structure of claim 1, wherein the second conductive layer comprises a pseudocapacitive material.

9. The structure of claim 8, wherein the pseudocapacitive material includes at least one of $RuO_2$, $MnO_2$, $V_2O_5$, $NiO_x$, and $CoO_x$.

10. An energy storage device, comprising:
    a first electrically conductive nanostructure having an array of channels with openings to a porous surface of the first nanostructured substrate and a first conductive layer on the array of channels to provide a first electrode;
    a dielectric layer disposed on the first electrically conductive nanostructure;
    a second electrically conductive nanostructure to provide a second electrode;
    an electrolyte between the dielectric layer and the second electrically conductive nanostructure; and
    an electrically insulating separator with ionic conductivity to separate the dielectric layer on the first electrically conductive nanostructure from the second electrically conductive nanostructure and to pass ions of the electrolyte through the electrically insulating separator to the dielectric layer that is between the electrically insulating separator and the first electrically conductive nanostructure, wherein the dielectric layer is configured to introduce an additional capacitor in series with a first capacitor that is created using the electrolyte and the first electrode and a second capacitor that is created using the electrolyte and the second electrode and to increase a voltage and an energy capacity of the energy storage device.

11. The energy storage device of claim 10, wherein the energy storage device is a nanostructured electrolytic capacitor, wherein the first electrode is a positive electrode and wherein the second electrode is a negative electrode.

12. The energy storage device of claim 11, wherein the electrically insulating separator is configured to provide a first electric double layer for the first capacitor and a second electric double layer for the second capacitor.

13. The energy storage device of claim 12, wherein the electrolyte is configured to repair and thicken the dielectric layer locally based on a leakage current of the dielectric layer.

14. The energy storage device of claim 11, wherein at least one of the first and second electrically conductive nanostructures comprises at least one of silicon, silicon carbide, germanium, carbon, or tin.

15. The energy storage device of claim 11, wherein at least one of the first and the second electrically conductive nanostructures comprises a nanostructured substrate that is formed using a conductive polymer, or a metal foam.

16. The energy storage device of claim 11, wherein the second electrically conductive nanostructure comprises a pseudocapacitive material.

17. A method, comprising:
   forming a first electrically conductive nanostructure having an array of channels with openings to a porous surface of the first nanostructured substrate and a first electrically conductive layer on the array of channels to provide a first electrode;
   forming a dielectric layer on the first electrically conductive layer;
   forming a second electrically conductive nanostructure to provide a second electrode;
   placing an electrolyte between the dielectric layer and the second electrically conductive nanostructure; and
   forming a separator to separate the dielectric layer on the first electrically conductive nanostructure from the second electrically conductive nanostructure and to pass the ions of the electrolyte through the separator to the dielectric layer that is between the separator and the first electrically conductive nanostructure, wherein the dielectric layer is configured to introduce an additional capacitor in series with a first capacitor that is created using the electrolyte and the first electrode and a second capacitor that is created using the electrolyte and the second electrode and to increase a voltage and an energy capacity of the structure.

18. The method of claim 17, wherein the first electrode is a positive electrode and the second electrode is a negative electrode of an energy storage device.

19. The method of claim 18, wherein the first capacitor and the second capacitor are electric double layer capacitors.

20. The method of claim 17, wherein the electrolyte is configured to repair and thicken the dielectric layer locally based on a leakage current of the dielectric layer.

21. The method of claim 17, wherein at least one of the first and the second electrically conductive nanostructure includes a nanostructured substrate that is formed using a conductive polymer, or a metal foam.

22. The method of claim 17, wherein the second electrically conductive nanostructure comprises a pseudocapacitive material.

23. A device, comprising:
   a substrate;
   a microprocessor over the substrate; and
   a energy storage device associated with the microprocessor, the energy storage device comprises a first electrically conductive nanostructure having an array of channels with openings to a porous surface of the first nanostructured substrate and a first electrically conductive layer on the array of channels to provide a first electrode, a dielectric layer disposed on the first electrically conductive layer, a second electrically conductive nanostructure to provide a second electrode, an electrolyte between the dielectric layer and the second electrically conductive nanostructure; and a separator to separate the first electrically conductive nanostructure from the second electrically conductive nanostructure and to pass ions of the electrolyte through the separator to the dielectric layer that is between the separator and the first electrically conductive nanostructure, wherein the dielectric layer is configured to introduce an additional capacitor in series with a first capacitor that is created using the electrolyte and the first electrode and a second capacitor that is created using the electrolyte and the second electrode and to increase a voltage and an energy capacity of the energy storage device.

24. The device of claim 23, wherein the first capacitor and the second capacitor are electric double layer capacitors.

25. The device of claim 24, wherein the electrolyte is configured to repair and thicken the dielectric layer locally based on a leakage current of the dielectric layer.

26. The device of claim 23, wherein at least one of the first and second electrically conductive nanostructures comprises at least one of silicon, silicon carbide, germanium, carbon, or tin.

27. The device of claim 23, wherein at least one of the first and second electrically conductive nanostructures includes a nanostructured substrate that is formed using a conductive polymer, or a metal foam.

28. The device of claim 23, wherein the energy storage device is monolithically integrated with the substrate of the device.

* * * * *